United States Patent [19]

Saxena

[11] Patent Number: 5,472,508
[45] Date of Patent: Dec. 5, 1995

[54] APPARATUS FOR SELECTIVE CHEMICAL VAPOR DEPOSITION OF DIELECTRIC, SEMICONDUCTOR AND CONDUCTIVE FILMS ON SEMICONDUCTOR AND METALLIC SUBSTRATES

[76] Inventor: Arjun N. Saxena, 2 Birch Hill Rd., Ballston Lake, N.Y. 12019

[21] Appl. No.: 4,380

[22] Filed: Jan. 14, 1993

Related U.S. Application Data

[62] Division of Ser. No. 743,546, Aug. 9, 1991, Pat. No. 5,212,118.

[51] Int. Cl.⁶ .................................................. C23C 16/00
[52] U.S. Cl. ........................ 118/723 E; 118/723 ER; 118/723 I; 118/725; 156/345
[58] Field of Search .................... 118/723 E, 723 ER, 118/723 I, 715, 725; 156/345

[56] References Cited

U.S. PATENT DOCUMENTS

| | | | |
|---|---|---|---|
| 4,340,617 | 7/1982 | Deutsch et al. . | |
| 4,406,765 | 9/1983 | Higashi et al. | 204/164 |
| 4,500,563 | 2/1985 | Ellenberger et al. | 118/723 R X |
| 4,664,938 | 5/1987 | Walker | 118/723 MP X |
| 4,668,365 | 5/1987 | Foster et al. | 118/723 E X |
| 4,683,147 | 7/1987 | Eguchi . | |
| 4,811,684 | 3/1989 | Tashiro et al. | 118/723 MP X |
| 4,826,585 | 5/1989 | Davis | 118/723 E X |
| 4,837,185 | 6/1989 | Yau et al. | 204/192.12 X |
| 4,851,302 | 7/1989 | Nakagawa et al. . | |
| 4,870,030 | 9/1989 | Markunas et al. . | |
| 4,971,667 | 11/1990 | Yamazaki et al. | 118/723 MP X |
| 5,212,118 | 5/1993 | Saxena . | |
| 5,223,039 | 6/1993 | Suzuki | 118/723 MP X |

FOREIGN PATENT DOCUMENTS

| | | |
|---|---|---|
| 0200539 | 11/1983 | Japan . |
| 0152154 | 6/1988 | Japan . |

*Primary Examiner*—Robert Kunemund
*Assistant Examiner*—Joni Y. Chang
*Attorney, Agent, or Firm*—Townsend and Townsend and Crew

[57] ABSTRACT

An apparatus and method for chemical vapor deposition in which the reactants directed toward a substrate to be provided with one or more films are first subjected to an electric field. The electric field is applied between two electrodes and the reactants become polarized in the field, thus stretching their polarized chemical bonds close to the breaking point. The apparatus also applies voltage pulses between one of the electrodes and the substrate. By adjusting the pulse height, pulse width and pulse repetition rates, the chemical bonds of polarized reactants break to produce free radicals and some ions of the desired elements or compounds. The substrate is kept at a given temperature. The free radicals react to deposit the desired film of high purity on the substrate. The deposition characteristics of the deposited films in terms of isotropic, anisotropic and selective deposition are controlled by the pulse height, width, repetition rates and by other process parameters. Such parameters also control the grain size and orientation of the deposited films. By choosing appropriate reactants other than those for CVD, e.g., for reactive ion etching (RIE), in-situ cleaning prior to CVD, RIE and post CVD etching and treatment of the films can be accomplished. The latter technique is useful for achieving in-situ planarization. To aid the dissociation process for producing the free radicals in ions from the reactants, an axial magnetic field axial to the direction of the applied electric field may also be used.

8 Claims, 1 Drawing Sheet

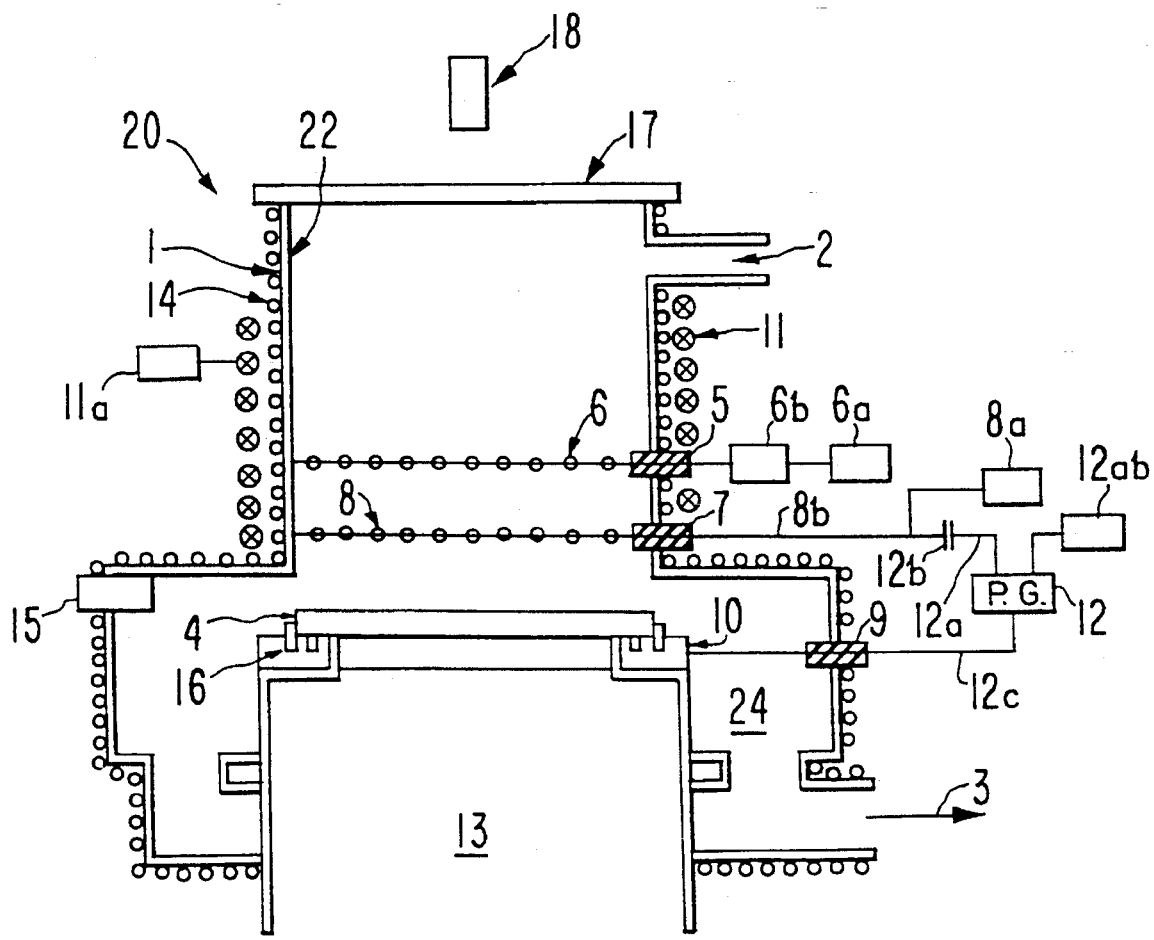
FIG_1

APPARATUS FOR SELECTIVE CHEMICAL VAPOR DEPOSITION OF DIELECTRIC, SEMICONDUCTOR AND CONDUCTIVE FILMS ON SEMICONDUCTOR AND METALLIC SUBSTRATES

This is a division of application Ser. No. 07/743,546 filed Aug. 9, 1991, now U.S. Pat. No. 5,212,118.

This invention relates to improvements in the formation of semiconductor and industrial/airline components and, more particularly, to apparatus and method for film deposition by chemical vapor techniques.

BACKGROUND OF THE INVENTION

In the conventional fabrication of microelectronic integrated circuits (I.C.'s), a variety of dielectric films (e.g., $SiO_2$, $Si_3N_4$), semiconductor films (e.g., epitaxial Si, polycrystalline Si, GaAs) and conductor films (e.g., W, $WSi_2$, TiN) are deposited by chemical vapor deposition (CVD) processes. These CVD processes are well known in the semiconductor processing field and can be classified into the following categories:

Thermal CVD (CVD, LPCVD, APCVD)

In this type of process, thermal energy is used to cause a chemical reaction to occur and to cause a deposit of the desired film on a substrate. Examples of the process are as follows:

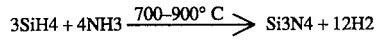

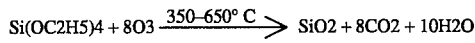

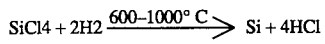

The temperatures required in the thermal CVD processes are generally higher than those required in the plasma enhanced CVD (PECVD) and photo CVD (PHCVD) processes described below. Also, a thermal CVD process tends to be isotropic because there is no energy in addition to thermal energy which can give direction to the chemical reaction which occurs. This contributes to the void formation in patterned geometries of small dimensions (<1 um) and pitches (<2 um) having large aspect ratios (>1).

Some variations of the CVD processes are to carry them out at low pressures (LPCVD), e.g., 1–10 mTorr, or at atmospheric pressures (APCVD), e.g., 500–760 mTorr. The differences in the LPCVD and APCVD processes in terms of the deposition rates and film properties depend upon the reaction chemistry. However, in general, the deposition rates in a LPCVD process are lower than in an APCVD process because the density of the reactants is smaller in the LPCVD process.

Plasma Enhanced CVD (PECVD)

In this type of process, a plasma is generated to create ions, free radicals and electrons which aid the chemical reaction to occur, usually at temperatures lower than those required for thermal CVD, and to produce the desired film on the substrate. The PECVD process is done at low pressures (e.g., 1–10 mTorr) which is necessary to create and sustain the plasma. This pressure constraint is one of the disadvantages of LPCVD because the density of the reactants is less than that in APCVD, which can result in lower deposition rates in the former. Examples of PECVD process is as follows:

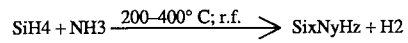

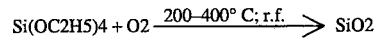

The free radicals generated in the plasma are very reactive, and their concentration is much higher than that of the ions. This can lead to gas phase nucleation of the reaction, causing unwanted particulate contamination in the film. Further, the unwanted species generated in the plasma as free radicals get incorporated in the film causing deleterious effects. The reactions occurring in a plasma process are quite complex. They depend on a variety of variables such as r.f. power, frequency, duty cycle, reactants, pressure, temperature and the design of the process chamber and electrodes of the system.

Photon-Induced CVD (PHCVD)

In this process, high-energy and high-intensity photons are used to dissociate and excite the reactant species in the gas phase for the chemical reaction to occur at rather low temperatures (e.g., even at room temperatures). The PHCVD process is done usually at near atmospheric pressure (e.g., 500–760 mTorr). For efficient transfer of the photon energy to the reactants for their excitation, catalytic agents such as mercury vapor are used for some processes. Also, lasers are used for some processes such as direct writing because of their frequency tunability and high intensity. However, PHCVD processes have not yet become production-worthy because of low density and deposition rate of, and contamination in, the deposited films.

Because of the numerous problems associated with conventional CVD as described above, a need exists to provide improvements in CVD. The present invention satisfies this need.

SUMMARY OF THE INVENTION

The present invention is directed to an apparatus and method for chemical vapor deposition in which the reactants directed toward a substrate to be provided with one or more films are first subjected to an electric field. The reactants first pass through the electric field applied between two electrodes and the reactants become polarized, thus stretching their polarized chemical bonds close to the breaking point.

The apparatus also includes pulse means which apply a voltage pulse between one of the electrodes forming the electric fields and the substrate, the latter generally being kept at ground potential. By adjusting the pulse height, pulse width and pulse repetition rates, the chemical bonds of polarized reactants break to produce free radicals and some ions of the desired elements or compounds. Relatively large numbers of these free radicals are created without the generation of a plasma which also means that the number of electrons produced is very small in the volume near the substrate which is kept at a given temperature. The free radicals react to deposit the desired film of high purity and almost free from particulate contamination. The ionized species of the reactants are much smaller in number than the free radicals. Due to the small number of ions and electrons generated, their deleterious effects are minimized, and the deposited films are almost free of radiation damage.

The deposition characteristics of the deposited films in terms of isotropic, anisotropic and selective deposition are controlled by the pulse height, width, repetition rates and by other process parameters. Such parameters also control the grain size and orientation of the deposited films. By choosing appropriate reactants other than those for CVD, e.g., for reactive ion etching (RIE), in-situ cleaning prior to CVD, RIE and post CVD etching and treatment of the films can be accomplished. The latter technique is useful for achieving in-situ planarization.

Selective CVD of a material, for instance, tungsten, on a surface, for example, AlCu, exposed through vias or trenches in a dielectric film, or vice versa, can be accomplished with the present invention by adjusting the pulse height, width and repetition rates. The differential induced charge on the desired surface causes selective CVD on such surface but not on the surrounding surfaces. By increasing the pulse height beyond the value needed for just breaking the chemical bond of the reactant, the energy of the desired element or compound can be increased. This feature of the present invention can provide a better epitaxial growth, for instance, of silicon, at temperatures lower than in the conventional processes mentioned above. Also, surface implantations or coatings can be achieved on large surfaces whether or not they are planar.

To aid the dissociation process for producing the free radicals from the reactants, an axial magnetic field axial to the direction of the applied electric field may also be used.

The primary object of the present invention is to provide an apparatus and method for chemical vapor deposition of dielectric, semiconductor and conductor films on a substrate after a reactant or reactants have passed through an electric field which stretches the polarized chemical bonds of the reactants close to the breaking point, following which electrical pulses are applied to the electric field to break up the reactants and cause the reactants to produce free radicals and some ions without the generation of plasma so that the free radicals react to deposit the desired film of high purity on the substrate with the film being substantially free from particulate contamination and radiation damage.

Another object of the present invention is to provide an apparatus and method of the type described, wherein the deposition and characteristics of the films in terms of isotropic, anisotropic and the selective deposition are controlled by the height, width, repetition rates of pulses applied to the electrode from which the reactants emerge so as to control the grain size and orientation of the films deposited on the substrate.

Other objects of this invention will become apparent as the following specification progresses, reference being made to the accompanying figure of drawing which shows a schematic view of the apparatus of the present invention.

BRIEF DESCRIPTION OF THE DRAWINGS

FIG. 1 illustrate the present invention.

DESCRIPTION OF THE PREFERRED EMBODIMENT

The apparatus of the present invention is broadly denoted by the numeral 20 and includes a hollow housing 22 defines a process chamber 1 having an inlet 2 for directing reactants, such as oxygen, silane, other compounds transported in the vapor phase, or their mixtures as required by the CVD processes. The apparatus has a port 17 for viewing and/or photon induced CVD.

Housing 22 has a lower hollow space 24 which is generally annular and in fluid communication with and forms a part of chamber 1. Space 24 has an outlet 3 to be coupled to a vacuum pump (not shown) for exhausting the space 24 of contaminants or reactants.

Means 16 is provided for mounting a substrate 4 on a heater assembly 13 surrounded by space 24. The mounting means 16 positions the substrate 4 at a location in space 24 aligned with chamber 1 so that reactants directed into chamber 1 will move downwardly and toward and onto the adjacent surface of the substrate after the reactants have passed through the electric field as hereinafter described. The entire apparatus can be configured easily such that the substrate surface is vertical, when appropriate modifications for substrate mounting and transport are made. Such modifications can be made by those conversant in the state of the art. It would further minimize the particle/contaminant deposition on the surface of the substrate, thereby giving higher quality films.

An upper electrode 6, preferably in the form of a perforated plate, is coupled to the inner surface of housing 22 and extends across chamber 1. A second electrode 8, preferably a perforated plate, is mounted on the inner surface of housing 22 in chamber 1 near its lower end thereof and spaced below the electrode 6. A voltage source 6A is coupled by a lead 6B and a feedthrough device 5 to electrode 6 for supplying voltage thereto. Similarly, a voltage source 8A is coupled by a lead 8B through a feedthrough device 7 to electrode 8 for supplying voltage to electrode 8. The voltage difference applied to the electrodes 6 and 8 produce an electric field whose intensity can be varied as desired. For instance, the voltage applied to electrode 6 can be cathodic and vary from +100 V to +1000 V while the voltage applied to electrode 8 can vary from a +1 V to +100 V. In such a case, the polarity of the electrodes would be such that electrode 6 would be negative with respect to electrode 8. For anodic polarity, the electrode 6 would have a voltage in the range of −100 to −1000 V while electrode 8 would have a polarity of −1 to −100 V, in which case, the polarity of the two electrodes would be such that electrode 8 would be negative with respect to electrode 6.

A pulse generator 12 is coupled by a lead 12A through a capacitor 12B to lead 8B and feedthrough 7. The pulse generator provides pulses of voltage which are additive to the voltage supplied by voltage source 8A. The pulses are applied to the electrode 8 for a purpose hereinafter described. Control means 12AB is provided to vary each of the pulse height, pulse width and pulse repetition rate of the pulses generated by pulse generator 12.

A lead 12C is directed through a feedthrough 9 and is coupled to the substrate 4 which places the substrate at ground potential.

A coil 11 is wound around housing 22 and is generally cylindrical such that a magnetic field generated by the coil when the coil is energized will be axial to the chamber 1. A means 11A is provided on the coil to energize the same.

A second tubular coil 14 is provided to receive a coolant or heater for providing temperature control of chamber 1. Means (not shown) is provided to supply a coolant or heater to tube 14.

A viewing port 15 is provided to view the CVD process just above the substrate. Port 15 is also used in the measurement of pressure and residual gas analysis in the chamber. The heater assembly 13 heats and controls the temperature of the substrate 4 outside chamber 1. Such assembly 13 is not part of the vacuum system which is evacuating chamber 1.

Chamber 1 has viewing port 17 through which a detector or spectrophotometer 18 can monitor the CVD process and can view the film surface of the substrate 4 through appropriate holes in the upper and lower electrodes 6 and 8. Port 17 also allows a light source 18, such as a scanning laser, to allow a photo-CVD (PHCVD) process to occur when optically transparent upper and lower perforated electrodes are used.

Chamber 1 has various ports such as inlet port 2 for reactants, exit port 3 for reaction products and pumping with a vacuum pump, and a load-locked entrance and retrieval port (not shown) for substrate 4, the substrate typically being a silicon wafer on which the chemical vapor deposition of films is to be accomplished. Chamber 1 can have a port for optical viewing (not shown) of the inner structure in the CVD reaction.

Pulse generator 12 produces the desired electrical pulses which cause the final dissociation of the reactants between the lower electrode 8 and substrate 4.

A typical CVD process is accomplished with apparatus 20 as follows:

1. A desired substrate 4 is introduced into the lower part of the apparatus 20 from the load-locked chamber through the entrance, retrieval port (not shown) on the substrate holder 10. Such a retrieval port is typically formed in a side wall of housing 22. The substrate is positioned automatically by mounting means 16 which typically are pins. The chamber 1 is then evacuated to a desired base pressure, such as 1 mTorr.
2. Heater 13 is energized to raise the substrate temperature to a desired value, such as 300° C.
3. Appropriate voltages are applied to upper and lower electrodes 6 and 8. The polarities of the voltages ($V_1$ and $V_2$ of electrodes 6 and 8, respectively, and those of the electrical pulses from pulse generator 12 depend upon desired dissociation characteristics of the reactants, whether or not they are cathodic or anodic. Examples of the voltage ranges and polarities of the molecules of the reactants to be passed through the electric field are given as follows:

|     | Cathodic    | Polarity | Anodic       | Polarity |
| --- | ----------- | -------- | ------------ | -------- |
| V1  | +100 to 100 V | −      | −100 to 1000 V | +      |
| V2  | +1 to 100 V   | +      | −1 to 100 V    | −      |

4. The desired CVD reactants are then introduced into chamber 1 up to an appropriate pressure, such as 100 mTorr, such reactants being O3 or silane.
5. Electrical pulses are appropriately applied by pulse generator 12 to the lower electrode 8. Examples of the pulse height and polarities for the cathodic and anodic cases are given as follows:

|     | Cathodic    | Polarity | Anodic       | Polarity |
| --- | ----------- | -------- | ------------ | -------- |
| V1  | +100 to 100 V | −      | −100 to 1000 V | +      |
| V2  | +1 to 100 V   | +      | −1 to 100 V    | −      |
| PG  | −1 to 100 V   | −<br>+ | +1 to 100 V    | +<br>−  |

6. The electrical pulses from pulse generator 12 are maintained for a time needed, such as 1 minute, for a desired film thickness, for instance, 5000 Å. The characteristics of the pulses, for example, pulse height, duty cycle, repetition rate, determine the properties of the process and films, for instance, blanket versus selective deposition, rate of deposition, stoichiometry, stress, grain size, anisotropy/isotropy.
7. The voltages are removed from electrodes 6 and 8 and pulse generator 12 is shut down along with heater 13 and the flow of reactants into inlet 2. The chamber 1 and space 24 are pumped down to a desired low pressure, such as 1 mTorr in chamber 1.
8. The chamber 1 is back-filled with an inert gas, such as nitrogen. The substrate 4 is removed through the load-locked chamber and the foregoing steps are repeated for the next substrate.

In several CVD processes, for example, deposition of a metal such as tungsten, in-situ cleaning and treatment of the surfaces in the contacts, vias and trenches is quite important. Such in-situ cleaning and treatment processes are not easy, if not impossible, to accomplish with currently available equipment. However, with the apparatus described in the present invention, such in-situ cleaning and treatment can be accomplished and controlled easily as follows.

Before introducing reactants, appropriate in-situ cleaning reactants, such as H2 and CF4, are introduced, following which steps 5, 6 and 7 are performed with the desired voltages on the electrodes 6 and 8, the pulse voltage of generator 12 and time for both appropriate cleaning and treatment of the surfaces. The anisotropy/isotropy of the cleaning can be controlled by the process conditions, including chamber pressure. For continuing with a CVD process, following the above in-situ cleaning and treatment process, proceed from step 2 to step 8.

Typical In-Situ Etching After CVD of a Film for Planarization

In several CVD processes, e.g., deposition of SiO2 or W, in-situ etching is required for the planarization of SiO2 or W-plug formation in contacts and vias. Such in-situ etching is possible in some conventional equipment available currently, but the anisotropy and isotropy of the etching cannot be controlled easily; also, considerable radiation damage is introduced due to the unwanted electrons and ions generated in the plasma. However, with the apparatus of the present invention, such in-situ etching with controlled anisotropy and isotropy can be done easily as follows, the radiation damage due to the electrons and ions being small, if not non-existent, because high-density plasma is not generated by apparatus 20 of the present invention.

First, perform the steps 1 through 7 to complete the CVD process to deposit a desired film. Next, return to step 2 to start the in-situ etch process. After setting the temperature, V1 and V2 to the desired values, introduce appropriate etching reactants in step 4, such as CF4, SF6, CCl4, CCl2F2 or NF3, instead of the CVD reactants. Perform the subsequent steps through step 8 to complete the in-situ etching after CVD of a film.

Typical In-Situ Cleaning, Multi-Step, Multi-Chemistry CVD with In-Situ Etching

For certain applications in microelectronics manufacturing, multilayers of dielectric and metal films are required. As an example, planarized SiO2 layer capped with a Si3N4 layer is used in several applications. Such a planarized dielectric layer is not easy, if not impossible, to deposit with the conventional CVD equipment. However, with the present invention, such a layer can be deposited easily. A desired sequencing of the steps given above with appropriate reactants and process conditions will produce such a layer.

Scaling Up the Size and Modification of the Electrode Shapes in This Invention for CVD/Etching/treatment on Non-Planar Surfaces, Such as Helicopter Rotor Blades, Turbines, Airplane Wings, and Space Shuttle Nose Cones For making the surfaces of various parts used in defense, space and industrial applications more resistant to erosion and deterioration under hostile environments, it is helpful to coat the surfaces of these parts with thin layers of suitable materials, such as Ti, Pt, SiC, Si3N4 and Cr. No commercially available equipment can provide such coatings easily. With the present invention, such coatings can be deposited easily, uniformly and reproducibly. Apparatus 20 can be scaled up to the desired size of the substrate to be coated.

Another key aspect of the present invention for such applications is that the electrodes 6 and 8 can be shaped to conform to the non-planar substrate to be coated. By choosing appropriate reactants for CVD, etching and/or treatment, a desired film can be grown uniformly on the substrate whose shape can be non-planar or any surface contour. By adjusting the voltages on electrodes 6 and 8, and the pulse height from the pulse generator, the deposition can approach surface implantation conditions and/or CVD of the desired film. Present techniques of sputtering, evaporation and ion implantation cannot accomplish such tasks easily or adequately.

What is claimed is:

1. Apparatus for chemical vapor deposition of a film on a substrate comprising:

means defining a process chamber having a gaseous inlet for receiving reactants and an outlet for gaseous flow out of the chamber;

means in the chamber for mounting a substrate on which a film is to be deposited; and means in the chamber for forming an electric field between the inlet and said substrate mounting means for polarizing the reactants, said electric field means including means for applying a voltage pulse of sufficient magnitude to break the chemical bonds of the polarized reactants to produce free radicals and ions while keeping the chamber free of plasma for use in depositing the film on the substrate.

2. Apparatus as set forth in claim 1, wherein said electric field means includes a pair of spaced electrodes in the chamber across the path of the reactants flowing between the inlet and the outlet.

3. Apparatus as set forth in claim 1, wherein the electric field means includes a first electrode in the chamber, means for supplying a voltage to the first electrode, a second electrode in the chamber and spaced from the first electrode, a second electrical voltage source coupled with the second electrode, said pulse generating means including a pulse generator coupled with one of the electrodes, and means coupled with the pulse generator for controlling the pulse height, duty cycle and repetition rate of the pulses.

4. An apparatus as set forth in claim 3, wherein the pulse generator is coupled to the second electrode, and wherein is included an electrical lead coupling the pulse generator with the substrate.

5. Apparatus as set forth in claim 1, wherein is included a coil surrounding the chamber and having means for forming a magnetic field in the chamber.

6. Apparatus as set forth in claim 5, wherein said magnetic field is axial with respect to the electric field.

7. Apparatus as set forth in claim 1, wherein is included coolant flow or heater means surrounding the chamber for directing a coolant therethrough or heat for controlling the temperature of the chamber.

8. Apparatus as set forth in claim 1, wherein is included the means below the substrate mounting means for heating a substrate mounted in the chamber.

\* \* \* \* \*